United States Patent
McLain et al.

(10) Patent No.: US 6,262,636 B1
(45) Date of Patent: Jul. 17, 2001

(54) APPARATUS FOR REVERSING DIRECTION OF SIGNAL FLOW IN A BROADBAND SIGNAL TAP

(75) Inventors: Dennis J. McLain, Duluth; Thomas B. Harton, IV, Alpharetta, both of GA (US); Timothy Tunnell, Naperville, IL (US); Mark E. Adams, Grayson; James T. Brown, Flowery Branch, both of GA (US)

(73) Assignee: Antec Corporation, Duluth, GA (US)

( * ) Notice: Subject to any disclaimer, the term of this patent is extended or adjusted under 35 U.S.C. 154(b) by 0 days.

(21) Appl. No.: 09/098,663

(22) Filed: Jul. 20, 1998

(51) Int. Cl.[7] .................................................. H01P 5/18
(52) U.S. Cl. ......................... 333/109; 333/100; 333/112
(58) Field of Search .................................. 333/100, 109, 333/112, 118, 119, 124, 131

(56) References Cited

U.S. PATENT DOCUMENTS 5,581,134 * 12/1996 Romerein et al. ............... 333/100 X
5,990,759 * 11/1999 Matsubara ....................... 333/112 X

* cited by examiner

Primary Examiner—Benny Lee
Assistant Examiner—Stephen E. Jones
(74) Attorney, Agent, or Firm—Troutman Sanders LLP; Gerald R. Boss (57) ABSTRACT

A broadband signal tap includes a reversible directional coupler and a make-before-break signal continuity bridge. The electronic circuitry of the directional coupler is provided on a daughterboard that is removably connected to a motherboard in the tap. The removable daughterboard has a plurality of symmetrically arranged connection means and the motherboard has a plurality of symmetrically arranged connection points for accepting connections with the plurality of symmetrically arranged outputs on the daughterboard. The connections on the motherboard and on the daughterboard are physically and functionally symmetrical, thereby permitting the daughterboard to be reversed. The daughterboard is maintained in a housing. The housing has elongated fingers which, when pushed downward onto the motherboard, penetrate through retaining holes in motherboard, thereby retaining the housing on the motherboard. An electrically conductive continuity bridge is provided on the bottom of the motherboard for maintaining electrical continuity of the broadband signal when the daughterboard is removed from the motherboard. The continuity bridge includes a unitary spring metal having a center portion and two end portions. Upon connection of the housing to the motherboard, the elongated fingers push against and urge the end portions of the continuity bridge away from connections on the motherboard, thus disengaging the electrically conductive continuity bridge. Conversely, when the housing is removed from the motherboard, the end portions of the continuity bridge make contact with connections on the motherboard before the connectors of the daughterboard are disconnected from the motherboard, thereby maintaining continuity of the broadband signal through the tap when the daughterboard is disconnected from the motherboard.

10 Claims, 4 Drawing Sheets

(PRIOR ART)

FIG 1

(PRIOR ART)

DAUGHTER BOARD FULLY ASSEMBLED ONTO MOTHER BOARD, BRIDGE CONTACTS DISENGAGED, COUPLER CONTACTS ENGAGED

FIG 6A

DAUGHTER BOARD PARTIALLY REMOVED FROM MOTHER BOARD, BRIDGE CONTACTS AND COUPLER CONTACTS ENGAGED

FIG 6B

DAUGHTER BOARD FULLY REMOVED FROM MOTHER BOARD, BRIDGE CONTACTS ENGAGED, COUPLER CONTACTS DISENGAGED

FIG 6C

APPARATUS FOR REVERSING DIRECTION OF SIGNAL FLOW IN A BROADBAND SIGNAL TAP

TECHNICAL FIELD

The present invention relates generally to an apparatus for network transmission, and in particular to a broadband signal tap with a reversible directional coupler and a make-before-break continuity bridge for use as part of a cable television, cable telephone, or data distribution system.

BACKGROUND OF THE INVENTION

Typical cable television system networks, such as for cable TV or CATV, include four main elements, a headend, a trunk system, a distribution system consisting of feeder cables bridged from the trunk system, and subscriber drops fed from broadband signal taps in the distribution system.

The headend, which is the central originating point of all signals carried on the network, receives signals from satellite, broadcasted, or transmitted by cable and transmits these signals as a broadband signal to numerous distribution nodes via trunk cables. Each distribution node, in turn, distributes the signals along with power, via feeder cables, with each feeder cable terminating at a termination block. Each feeder cable has numerous broadband signal taps inserted between the distribution node and the termination block. Each of these broadband signal taps draws a portion of the broadband signal and power for use by a subscriber, typically a home or business, and transmits the remaining broadband signal to the next tap along the feeder cable. Typically, there are hundreds, and sometimes thousands, of subscribers connected to each feeder cable. At a subscriber's site, the subscriber's equipment is connected to the tap via a drop cable, which may terminate directly into the television receiver on 12-channel systems, or into a converter where more than 12 channels are provided.

The individual broadband signal taps are connected in series along the feeder cable, the feeder cable being connected to an input terminal of the broadband signal tap. Within the broadband signal tap the broadband signal is split, and a small portion of the broadband signal is delivered to the subscriber through a subscriber drop cable. The remainder of the signal is returned to the feeder cable. By their very nature, these broadband signal taps are directional, so they must be installed so they can extract signal in the direction of the signal flow.

A disadvantage of prior broadband signal taps is that if one of the taps in a series of taps is out of service, the subscribers downstream of the out-of-service tap will be deprived of service. Service interruptions, even if for just a few milliseconds, can have serious and even catastrophic consequences for the transmission of digital data. Unlike analog signals, loss of even a small portion of a digital data transmission can render the transmission unintelligible, or cause a failure of the signals to reach the intended destination. With the advent of pay-per view and interactive television, and the increased use of cable systems for telephone voice and data transmission, it has become extremely important to provide means to maintain continuity of service to the subscribers.

Furthermore, the growth in the broadband industry has created a need for an infrastructure that can be readily modified and that can grow with the customer needs. Such modifications must be able to be provided with only minimal adverse impact to the existing customers. Thus, it is often necessary to add extra trunks, branches along the feeder cables or trunk lines, or to make other modifications to the system infrastructure. When this is done, it is often necessary to reverse the direction of signal flow along the feeder cables. This is typically accomplished by disconnecting the tap from the feeder cable and installing the tap in the opposite direction. Such a reversing of the tap, however, is a costly and time-consuming process that deprives hundreds or thousands of downstream subscribers of service during the time required to disconnect and reconnect the tap in the opposite direction.

Accordingly, there is a need for a broadband signal tap having a reversible directional coupler. Thus, if a change in the direction of the signal flow is required, such a reversal in signal direction is easily accomplished by merely changing the direction of the coupler, rather than removing the entire tap. Preferably, during the time required to reverse the directional coupler, there should not be any disturbance or interruption of service. Thus, there is a need for a broadband signal tap with a reversible directional coupler, which has a make-before-break connection such that the continuity of the broadband signal is maintained through the tap while the directional coupler is being reversed.

SUMMARY OF THE INVENTION

The present invention includes a broadband signal tap for use in connection with a network communication system that has one or more distribution nodes, with at least one feeder cable connected to a distribution node and broadband signal taps serially connected along the feeder cable. The broadband signal tap of the present invention includes a reversible directional coupler and a make-before-break signal continuity bridge. The reversible directional coupler allows for the reversal of the directional coupler's connections in the tap, and the continuity bridge maintains broadband signal continuity to downstream subscribers during the reversal of the direction coupler.

The directional coupler includes an input for receiving the broadband signal from the system through a first coupling means on a motherboard in the tap, a subscriber output for providing the extracted portion of the broadband signal to a subscriber through subscriber coupling means on the motherboard, and a return output for providing the remainder of the broadband signal to the system through second coupling means on the motherboard.

The electronic circuitry of the directional coupler is provided on a daughterboard that is removably connected to the motherboard within the tap. The removable daughterboard has a plurality of symmetrically arranged output connection means that constitute the input, subscriber output, and return output. The daughterboard may also contain symmetrically arranged outputs that constitute ground connectors.

The motherboard includes a plurality of symmetrically arranged connection points for accepting connections with the plurality of symmetrically arranged connection means on the daughterboard. The motherboard preferably includes connection points that constitute the first coupling means, subscriber coupling means, and second coupling means. The motherboard many also include connection points for the grounding means. Preferably, the connection means on the daughterboard are connection pins and the connection points on the motherboard are small apertures of a suitable dimension to accept the pins on the daughterboard.

The connections on the motherboard and on the daughterboard are physically and functionally symmetrical, thereby permitting the daughterboard to be reversed. The connection of the daughterboard to the motherboard can be reversed such that the daughterboard can be connected to the motherboard in either a first or second position. When the daughterboard is connected to the motherboard in a first position, the input of the directional coupler on the daughterboard is connected to the first coupling means on the motherboard, the subscriber output on the daughterboard is connected to the subscriber coupling means on the motherboard, and the return output on the daughterboard is connected to the second coupling means on the motherboard.

Conversely, when the daughterboard is reversed and connected to the motherboard in the second position, the input on the daughterboard is connected to the second coupling means on the motherboard, the subscriber output on the daughterboard is connected to the subscriber coupling means on the motherboard, and the return output on the daughterboard is connected to the first coupling means on the motherboard.

In this manner, when the daughterboard is connected to the motherboard in the first position, the broadband signal is transmitted through the tap in a first direction and when the daughterboard is connected to the motherboard in the second position, the broadband signal is transmitted through the tap in the reverse direction.

In another implementation of the present invention, the daughterboard further comprises ground connectors and the motherboard further comprises ground coupling means for electrically grounding the circuitry of directional coupler. Again, for the daughterboard to be effectively reversed, the ground connections on the daughterboard and motherboard must be physically and functionally symmetrical.

The daughterboard that contains the directional coupler's electronic circuitry is maintained within a housing. The housing has elongated fingers terminating in snap tangs. When the housing is pushed downward onto the motherboard, the fingers and tangs penetrate through retaining holes in motherboard, thereby retaining the housing on the motherboard. It should be understood that when the fingers and tabs of the housing are placed through the retaining holes on the motherboard, the connectors on the daughterboard are aligned with and connect to the connectors on the motherboard.

An electrically conductive continuity bridge is provided on the bottom of the motherboard for maintaining electrical continuity between the first and second coupling means when the daughterboard is removed from the motherboard. The electrically conductive continuity bridge preferably comprises a unitary spring metal having a center portion and two end portions. The end portions of the continuity bridge have offset tabs for making contact with the first and second coupling means on the motherboard when the housing is not connected to the motherboard.

Upon connection of the housing to the motherboard, the elongated fingers push against and urge tabs of the continuity bridge away from the first coupling means and the second coupling means on the motherboard, thus disengaging the electrically conductive continuity bridge. Conversely, when the housing is removed from the motherboard, the tabs of the continuity bridge contact the first and second coupling means on the motherboard before the connectors of the daughterboard are disconnected from the motherboard. In this manner, the broadband signal is transmitted from the feeder cable through the tap and returned to the feeder cable when the directional coupler is removed from the motherboard during reversal.

Thus, the present invention allows for the direction of the broadband signal through the tap to be reversed without having to remove the tap from the feeder cables, by merely reversing the connections of a daughterboard within the tap. The continuity bridge of the present invention maintains a make-before-break continuity thereby ensuring continued service to downstream subscribers during the process of reversing the directional coupler.

DETAILED DESCRIPTION OF THE PREFERRED EMBODIMENTS

Figure 1:
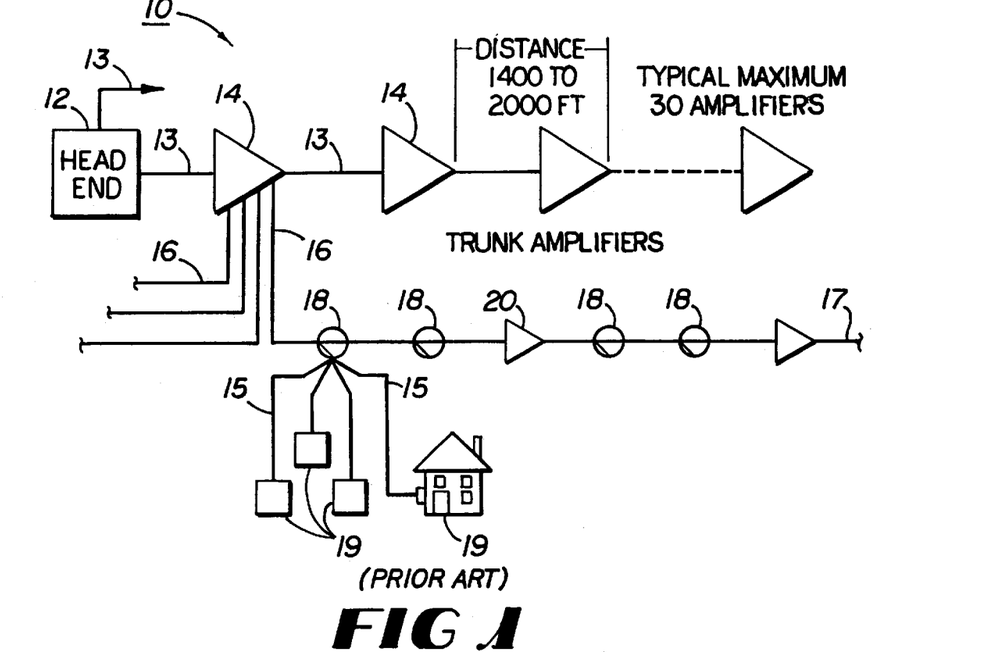
FIG. 1 is a system block diagram of a network for a typical communication or CATV system.

Referring now in detail to the drawing figures, wherein like reference numerals represent like parts throughout the several views, FIG. 1 shows a typical communication or CATV system 10. The headend 12 is the originating point for all signals transmitted downstream. Sources for the signal transmitted by the headend 12 include off-the-air stations, satellite services, terrestrial microwave relays and signals originating at the headend. All signals are processed and combined for transmission at the headend.

Headend 12 distributes the broadband signals through trunk cables 13. Each trunk cable 13 distributes the signal to distribution nodes 14, which in turn distribute the signal through feeder cables 16. Each feeder cables 16 terminates at termination block 17. A number of broadband signal taps 18 and a lesser number of feeder amplifiers 20 are serially interposed along feeder cable 16 between distribution node 14 and termination block 17. Each broadband signal tap draws a small portion of the signal transmitted through feeder cable 16 and delivers it to a subscriber 19, such as a home or business. Typically, there are hundreds and sometimes thousands of subscribers 19 supported by each feeder cable 16. The broadband signal taps 18 are connected to respective subscriber terminal equipment via subscriber drop cables 15.

As described above, broadband signal taps 18 are serially interposed along feeder cables 16. In prior broadband signal taps, removing or disassembling one of the broadband signal taps caused an interruption of service to the remaining subscribers downstream of the broadband signal tap. While this is a serious problem for the analog cable TV industry, it is even more serious if the same cable system carries telephone communications or if it carries digital information. Subscribers and governmental regulatory agencies are less forgiving to interruptions in telephone service, compared to interruptions in cable television service. With regard to digital transmission, even short duration interruptions in service can have serious or even catastrophic results, such as transmission unintelligibility or failure of the signal and programming to reach its intended destination.

Figure 2:
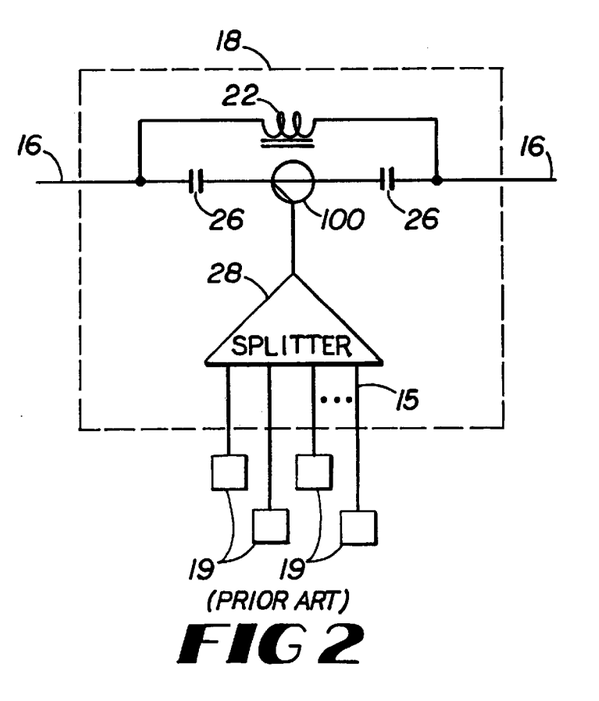
FIG. 2 is a block diagram of a typical broadband signal tap commonly used in the cable system of FIG. 1.

FIG. 2 is a block diagram of a typical broadband signal tap 18 commonly used in the system of FIG. 1. In general, the broadband signal tap removes an appropriate amount of energy from the broadband signal carried by feeder line 16 and splits the signal for distribution to the subscribers 19. The broadband signal tap 18 comprises an AC power bypass choke 22, a directional coupler 100, AC power blocking capacitors 26, and a splitter 28. Splitter 28 provides for subscriber drop cables 15 to be connected between the tap and a plurality of subscribers, typically from two to eight subscribers. The directional coupler 100 prevents reflected signals from traveling along the feeder cables 16 which could cause ghosting problems on subscribers' receivers.

Because of the growth in the broadband industry it is often necessary to add extra trunks or branches along the feeder cables or trunk lines, or make other modifications to the system infrastructure. When this is done, it is often necessary to reverse the direction of the signal flow along feeder cables 16. Because the broadband signal taps are directional devices, this reversal of the signal flow must be done by physically removing the entire broadband signal tap and installing it in the opposite direction. However, the disconnection and re-installation of the tap in the opposite direction is a costly and time-consuming process that temporarily deprives downstream subscribers of service.

Figure 3:
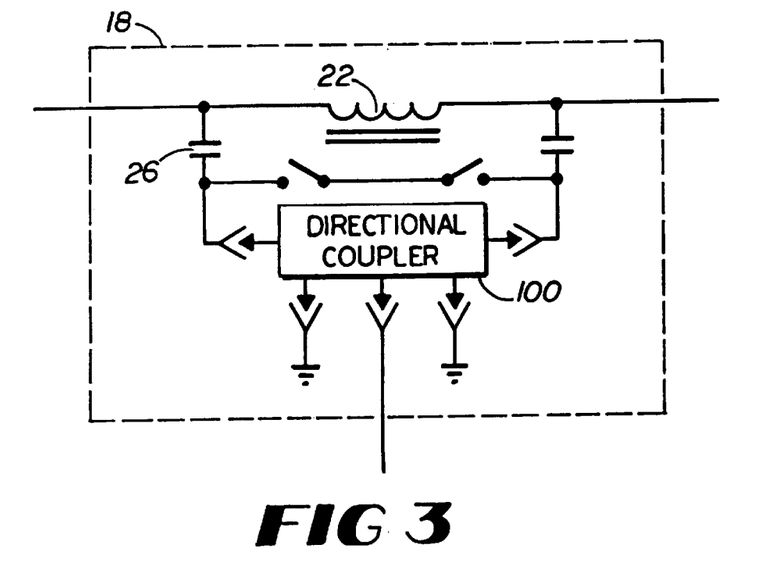
FIG. 3 is a circuit schematic diagram of a broadband signal tap in accordance with the present invention for reversing the direction of broadband signal flow across the directional coupler.
Figure 4:
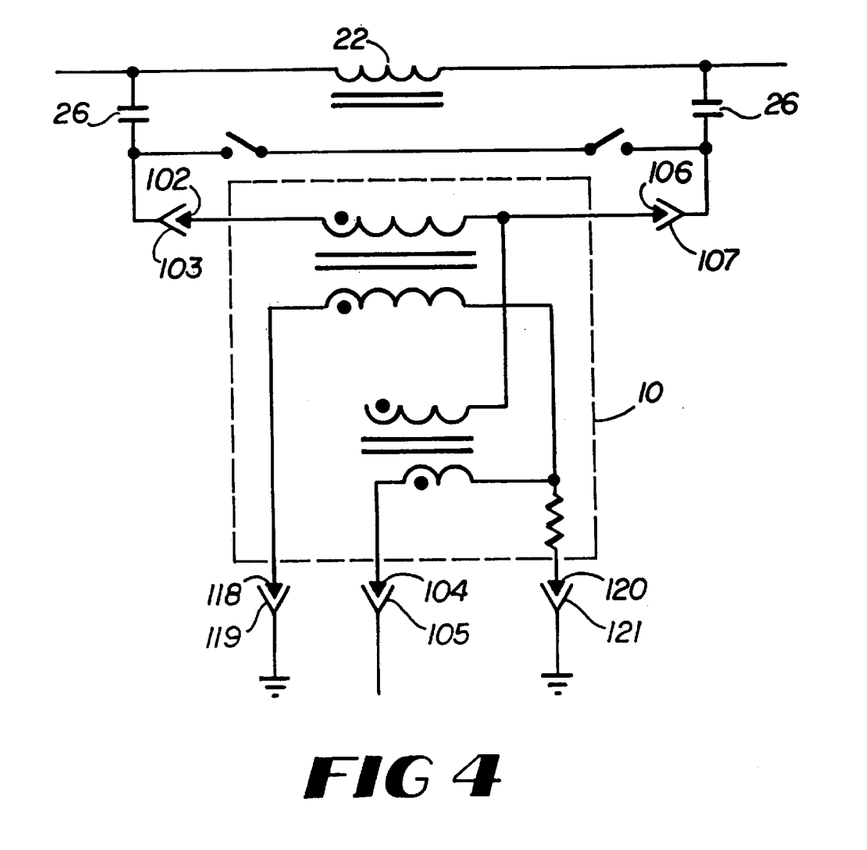
FIG. 4 is a detailed schematic view of the connections between the daughterboard and the motherboard illustrated in FIG. 3.

FIGS. 3 and 4 disclose a broadband signal tap in accordance with the present invention having a reversible directional coupler 100 and a make-before-break signal continuity bridge for reversing the directional coupler's connections between a first coupling means 103 and a second coupling means 107 while maintaining signal continuity to downstream subscribers.

FIG. 3 is a circuit schematic diagram of a broadband signal tap 18 in accordance with the present invention for reversing the direction of broadband signal flow through the tap. Broadband signal tap 18 comprises a power bypass choke 22 which has the appropriate value to act as an RF choking, thus coupling AC power around the broadband signal tap point. The broadband signal tap point comprises AC power blocking capacitors 26, the directional coupler 100, and continuity bridge 140.

FIG. 4 shows a directional coupler 100.

Directional coupler 100 includes an input 102 for receiving the broadband signal from coupling means 103, a subscriber output 104 for providing the extracted portion of the broadband signal to a subscriber or subscribers through subscriber coupling means 105, and a return output 106 for providing the remainder of the broadband signal to the feeder cable through second coupling means 107. The first coupling means 103 is connected to a first capacitor 26 for connection to or from a feeder cable for receiving or transmitting the broadband signal (and possibly also a power signal). The second coupling means 107 is connected to a second capacitor 26 for connection to or from a feeder cable for transmitting or receiving the broadband signal (and possibly also a power signal). It will be understood that if the first coupling means 103 is connected for receiving the broadband signal from the feeder cable, then the second coupling means 107 is connected for transmitting the remaining portion of the broadband signal from the directional coupler to the feeder cable, and vice versa.

Figure 5A:
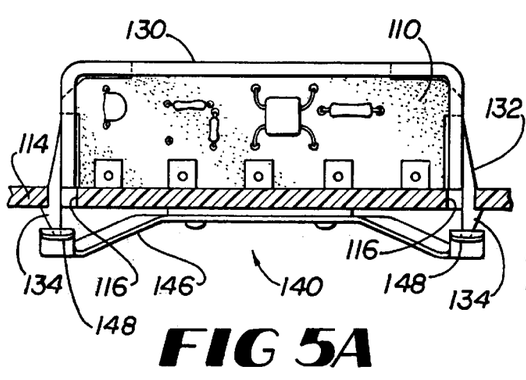
FIGS. 5A, 5B, and 5C are a front view, side view and isometric exploded view, respectively, of the daughterboard and its engagement with the motherboard and continuity bridge.
Figure 5B:
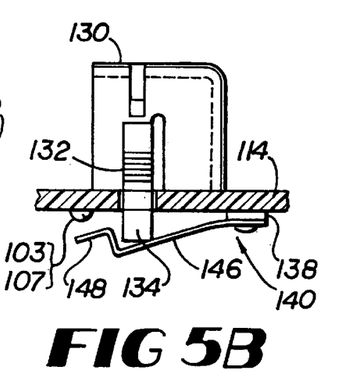
Figure 5C:
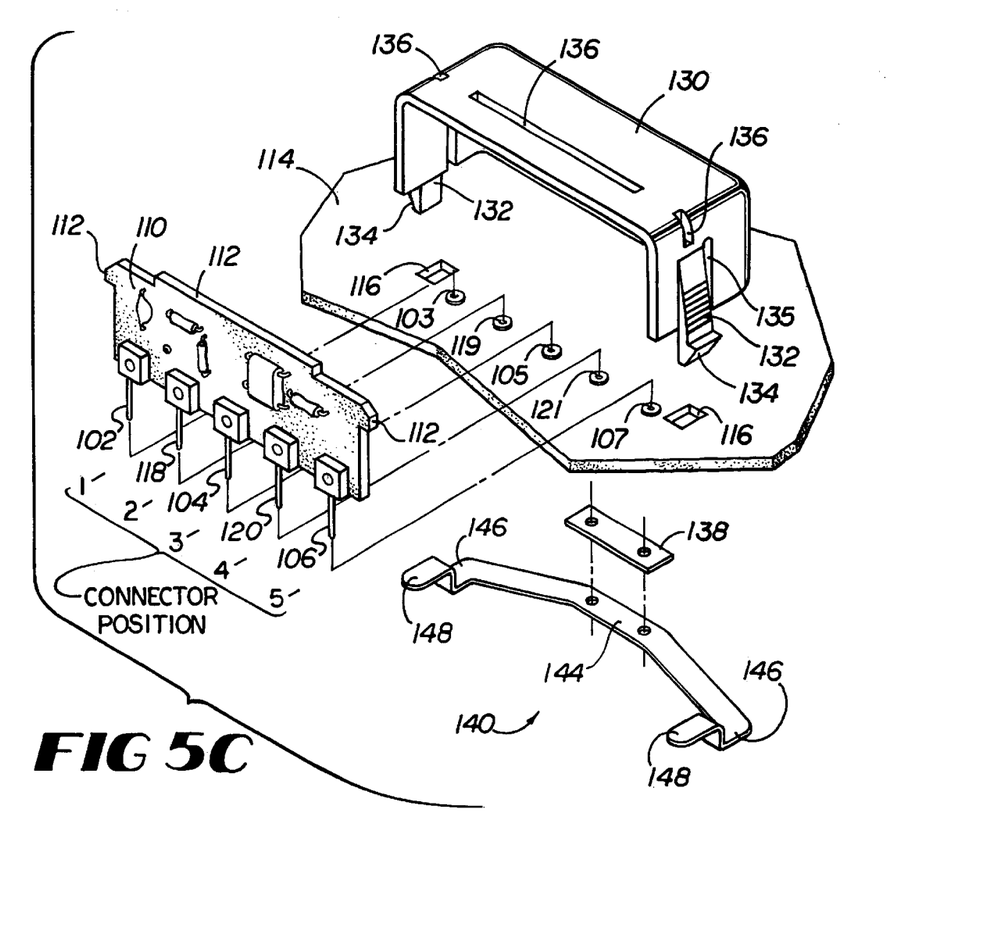

FIG. 4 shows a removable daughterboard 110 which contains the electronic circuitry of the directional coupler 100 thereon. Therefore, the directional coupler input 102, directional coupler return output 106, and directional coupler subscriber output 104 are located on the daughterboard. As best seen in FIGS. 5A–C, the removable daughterboard 110 has a plurality of symmetrically arranged connection pins that constitute input 102, subscriber output 104, and return output 106. The daughterboard may also contain symmetrically arranged outputs that constitute ground connectors 118 and 120.

The motherboard 114 preferably comprises a plurality of symmetrically arranged connection points for accepting connections with the plurality of symmetrically arranged outputs on the daughterboard. The motherboard preferably includes connection points that constitute the first coupling means 103, subscriber coupling means 105, second coupling means 107, and may include connection points for grounding means 119 and 121. Preferably, the connection means on the daughterboard are connection pins and the connection points on the motherboard are small apertures of a suitable dimension to accept the pins on the daughterboard.

When the daughterboard 110 is connected to the motherboard 114 in a first position, as shown in FIG. 5C, the input 102 of the directional coupler is connected to the first coupling means 103, the subscriber output 104 of the directional coupler is connected to the subscriber coupling means 105, and the return output 106 of the directional coupler is connected to the second coupling means 107. Conversely, when the daughterboard is reversed and connected to the motherboard 114 in a second position, the input 102 of the directional coupler 100 is connected to the second coupling means 107, the subscriber output 104 of the directional coupler is connected to the subscriber coupling means 105, and the return output 106 of the directional coupler 100 is functionally connected to the first coupling means 103.

It will be understood that for the daughterboard 110 to be effectively reversed, the connections on the motherboard and on the daughterboard must be physically and functionally symmetrical. Thus, the connections on the motherboard 114 and daughterboard 110 should preferably be physically and functionally arranged as identified in Table I below. It should be understood that the connector positions identified as 1–5, referred to in the table and shown in FIG. 5C, are for the sake of discussion only.

TABLE I

| Connector Position | Daughterboard Connection (in First Position) | Daughterboard Connection (in Second Position) | Motherboard Connection |
|---|---|---|---|
| 1 | Input 102 | Return output 106 | First coupling means 103 |
| 2 | None | None | None |
| 3 | Subscriber output 104 | Subscriber output 104 | Subscriber coupling means 105 |
| 4 | None | None | None |
| 5 | Return output 106 | Input 102 | Second coupling means 107 |

Thus, when the daughterboard is connected to the motherboard in the first position, the directional coupler input 102 is connected to the first coupling means 103, subscriber output 104 is connected to subscriber coupling means 105, and return output 106 is connected to the second coupling means 107 on the motherboard. When the daughterboard is reversed and connected to the motherboard in the second position, the input 102 is connected to the second coupling means 107, the subscriber output 104 is connected to the subscriber coupling means 105, and the return output 106 is connected to the first coupling means 103 on the motherboard.

Thus, it will be understood that when the daughterboard is connected to the motherboard in the first position, the broadband signal is transmitted through the tap in a first direction and when the daughterboard is connected to the motherboard in the second position, the broadband signal is transmitted through the tap in the reverse direction.

In another implementation of the present invention, the removable daughterboard 110 further comprises ground connectors 118 and 120 and the motherboard 114 further comprises ground coupling means 119 and 121 for electrically grounding the circuitry of directional coupler 100. Again, for the daughterboard 110 to be effectively reversed, the connections must be such that upon reversal, they remain physically and functionally symmetrical. Thus, the connectors in the motherboard 114 and daughterboard 110 could be arranged as identified below in Table II:

TABLE II

| Connector Position | Daughterboard Connection (in First Position) | Daughterboard Connection (in Second Position) | Motherboard Connection |
|---|---|---|---|
| 1 | Input 102 | Return output 106 | First coupling means 103 |
| 2 | Ground connector 118 | Ground connector 120 | Ground coupling means 119 |
| 3 | Subscriber output 104 | Subscriber output 104 | Subscriber coupling means 105 |
| 4 | Ground connector 120 | Ground connector 118 | Ground coupling means 121 |
| 5 | Return output 106 | Input 102 | Second coupling means 107 |

Thus, when the daughterboard 110 is connected to the motherboard 114 in a first position, the directional coupler input 102 is connected to the first coupling means 103, ground connector 118 is connected to ground coupling means 1 19, subscriber output 104 to subscriber coupling means 105, ground connector 120 is connected to ground coupling means 121, and the return output 106 is connected to the second coupling means 107. When the daughterboard is reversed and connected to the motherboard in the second position, the input 102 is connected to the second coupling means 107, ground connector 118 is connected to ground coupling means 121, subscriber output 104 is connected to subscriber coupling means 105, ground connector 120 is connected to ground coupling means 119, and return output 106 is connected to the first coupling means 103.

Those skilled in the art will realize that other connection arrangements between the directional coupler on the daughterboard and the connections on the motherboard may be used without departing from the spirit and teachings of the present invention.

FIGS. 5A, 5B, and 5C show a front view, side view and isometric exploded view, respectively, of the daughterboard 110 as it is connected to the motherboard 114. Preferably, the daughterboard that contains the directional coupler's electronic circuitry is maintained within a housing 130. The housing 130 serves several purposes, including providing mechanical support for the daughterboard 110 and facilitating the handling, insertion, and removal of the daughterboard 110 from the motherboard 114.

As shown in FIG. 5C, the daughterboard 110 has retaining tabs 112 that fit within slots 136 of housing 130 thereby attaching the daughterboard to the housing. Housing 130 also has elongated fingers 132 terminating in snap tangs 134. When the housing is pushed downward onto the motherboard, fingers 132 and tangs 134 penetrate through retaining holes 116 in motherboard 114, thereby retaining housing 130 on the motherboard. FIGS. 5B and 5C show relief slot 135 which is cut into housing 130 to give flexibility to the elongated fingers 132. It should be understood that when the fingers and tabs of the housing are placed through the retaining holes on the motherboard, the connection pins 102, 118, 104, 120, and 106 on the daughterboard mate with connection points 103, 119, 105, 121, and 107, respectively, on the motherboard when the daughterboard is in the first position, thereby providing the broadband signal from the feeder cable to the directional coupler. As discussed above, the daughterboard can also be reversed and the housing and daughterboard connectors connected to the motherboard in the second position.

An electrically conductive continuity bridge 140 is provided on the bottom of the motherboard for maintaining electrical continuity between the first and second coupling means 103 and 107 when the daughterboard 110 is removed from the motherboard 114. The electrically conductive continuity bridge 140 preferably comprises a unitary spring metal having a center portion 144 and end portions 146. An insulator 138 is interposed between the center portion 144 and the motherboard 114. Thus, upon attaching the continuity bridge to the motherboard 114, the insulator 138 prevents undesired shorting by the unitary spring metal. Preferably, the end portions 146 of the have offset tabs 148 for making functional contact with the first and second coupling means 103 and 107 on the motherboard when the housing is not connected to the motherboard.

As shown in FIG. 5B, upon connection of housing 130 to motherboard 114, the connection pins on the daughterboard are mated with the connection points on the motherboard. The elongated fingers 132 push against and urge tabs 148 of the continuity bridge away from the first coupling means 103 and the second coupling means 107, thus disengaging the electrically conductive continuity bridge 140. Thus, it will be understood that the connection between the daughterboard and the motherboard is made prior to the disengagement of the continuity bridge from first and second coupling means 103 and 107 on the motherboard.

Figure 6A:
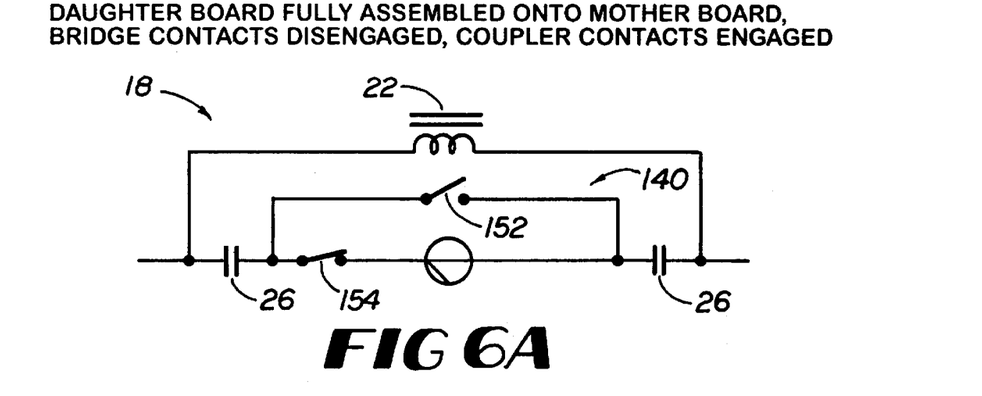
FIGS. 6A, 6B, and 6C are schematic diagrams of the broadband signal tap illustrating the engagement and disengagement of the continuity bridge contacts and the motherboard to daughterboard connections.
Figure 6B:
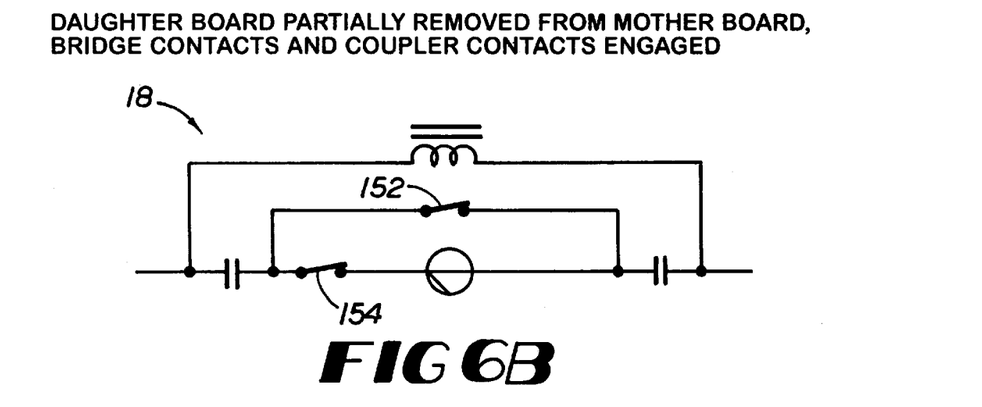
Figure 6C:
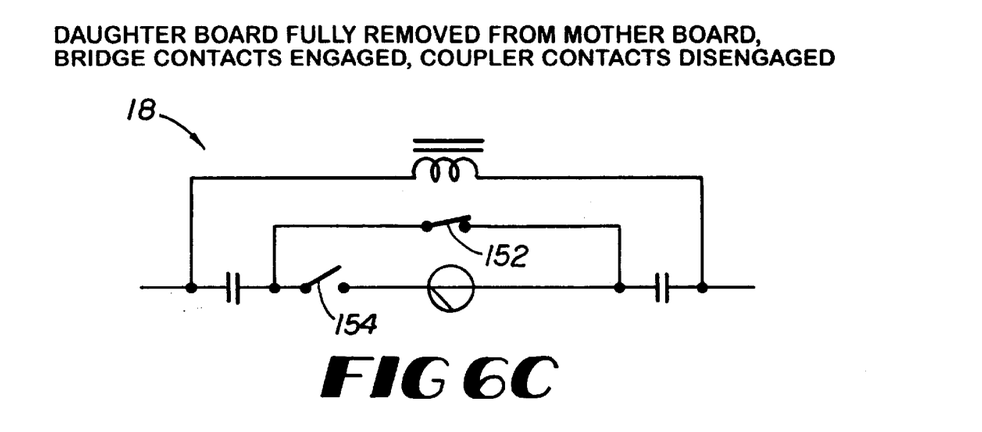

FIGS. 6A–C are schematic diagrams of the broadband signal tap illustrating the engagement and disengagement of the continuity bridge contacts and the make-before-break functionality of the continuity bridge of the present invention. Bridge contact switch 152 represents the contacts between the offset tabs 148 of continuity bridge 140 and the first and second coupling means 103 and 107. Mother/daughter contact switch 154 represents the contacts between the daughterboard 110 and motherboard 114 as previously discussed. It should be understood that mother/daughter contact switch 154 actually consists of the engagement of the connection pins on the daughterboard that mate with the connection points on the motherboard, as discussed above with regard to FIGS. 3–5.

When the housing is fully engaged and attached to the motherboard, the connection pins on the daughterboard touch and make contact with the connection points on the motherboard while elongated fingers on the housing push against the spring end portions 146 such that tabs 148 are disengaged from the first and second coupling means 103 and 107 on the motherboard, as discussed above. Thus, at this point, continuity bridge 140 is fully disengaged and bridge contact switch 152 is open, while mother/daughter contact switch 154 is closed.

Upon partial removal of the housing from the motherboard, the contacts on the daughterboard remain in contact with the contacts on the motherboard while elongated fingers move away from the spring end portions 146, thus allowing the tabs of the continuity bridge 140 to engage the first and second coupling means 103 and 107. Thus, at this point, continuity bridge 140 is fully engaged and bridge contact switch 152 is closed, while mother/daughter contact switch 154 remains closed.

Upon complete removal of the housing from the motherboard, the contacts on the daughterboard break contact with the contacts on the motherboard while elongated fingers, having moved away from the spring end portions 146, allowed the tabs 148 of the continuity bridge 140 to engage the first and second coupling means 103 and 107. Thus, at this point, continuity bridge 140 is fully engaged and bridge contact switch 152 is closed, while mother/daughter contact switch 154 is open.

During insertion of housing 130 onto motherboard 114, the above-described connections take place in reverse. Thus, the continuity bridge of the present invention maintains a make-before-break continuity thereby ensuring continued service to downstream subscribers during the process of reversing the directional coupler.

While the invention has been disclosed in preferred forms, it will be apparent to those skilled in the art that many modifications, additions, and deletions can be made without departing from the spirit and scope of the invention as set forth in the following claims.

What is claimed is:

1. A broadband signal tap for use in connection with a communication system that distributes a broadband signal to a plurality of subscribers, said tap comprising:
   a motherboard having symmetrically arranged connection points connected respectively to a first coupling means for receiving the broadband signal from the system, a subscriber coupling means for transmitting a portion of said broadband signal to a subscriber, and a second coupling means for returning the broadband signal to the system;
   a daughterboard having the electronic circuitry of a directional coupler thereon, said daughterboard having symmetrically arranged connection means constituting said directional coupler's input for receiving the broadband signal, subscriber output for providing a portion of the broadband signal to a subscriber, and return output for providing the remainder of the broadband signal to the system;
   a housing for maintaining the daughterboard therein, said housing including elongated fingers that penetrate through holes in the motherboard to removably connect the daughterboard to the motherboard in either a first or second position;
   wherein said daughterboard is removably connected to said motherboard, and wherein said symmetrically arranged connection means on the daughterboard mate with the symmetrically arranged connection points on the motherboard in either a first position or a second position;
   wherein in the first position the directional coupler's input, subscriber output, and return output are connected to the first coupling means, subscriber coupling means, and second coupling means, respectively; and
   wherein in the second position the directional coupler's input, subscriber output, and return output are connected to the second coupling means, subscriber coupling means, and first coupling means, respectively.

2. The broadband signal tap as recited in claim 1 wherein when the daughterboard is connected to the motherboard in the first position, the broadband signal is transmitted through the tap in a first direction and when the daughterboard is connected to the motherboard in the second position, the broadband signal is transmitted through the tap in the reverse direction.

3. The broadband signal tap as recited in claim 1 wherein the connection means on the daughterboard are connection pins and the connection points on the motherboard are small apertures of a suitable dimension to accept the pins on the daughterboard.

4. The broadband signal tap as recited in claim 1 wherein:
   said motherboard further includes a plurality of symmetrically arranged ground coupling means for connection to electrical ground and said daughterboard further includes a plurality of symmetrically arranged ground connectors; and
   wherein when said daughterboard is connected to said motherboard in either the first or second position, said ground connectors mate with said ground coupling means, thereby electrically grounding the electrical circuitry of said directional coupler.

5. The broadband signal tap as recited in claim 1 further comprising:
   an electrically conductive continuity bridge connected to the motherboard;
   wherein said continuity bridge maintains electrical continuity between said first and second coupling means on the motherboard when said daughterboard is not connected to said motherboard; and
   wherein said continuity bridge breaks electrical continuity between said first and second coupling means on the motherboard when said daughterboard is connected to said motherboard.

6. The broadband signal tap as recited in claim 5 wherein when said daughterboard is connected to said motherboard, the mating of the connection means on the daughterboard to the connection points on the motherboard occurs before the continuity bridge breaks electrical continuity between said first and second coupling means on the motherboard.

7. The broadband signal tap as recited in claim 5 wherein when said daughterboard is removed from said motherboard, the continuity bridge makes electrical continuity between said first and second coupling means on the motherboard before the connection means on the daughterboard are removed from the connection points on the motherboard.

8. The broadband signal tap as recited in claim 5, wherein said continuity bridge comprises:
   a unitary spring metal having a center portion; and
   first and second end portions on said unitary spring metal, wherein each respective end portion is biased to make contact with said first and second coupling means, respectively, when the housing is removed from the motherboard.

9. The tap as recited in claim 8 wherein said fingers of said housing, when pushed through holes in the motherboard to removably connect the daughterboard to the motherboard in either a first or second position, urge each end portion of said continuity bridge away from the first and second coupling means on the motherboard.

10. A broadband signal tap for use in connection with a communication system that distributes a broadband signal to a plurality of subscribers, said tap comprising:
    a motherboard having symmetrically arranged connection points connected respectively to a first coupling means for receiving the broadband signal from the system, a subscriber coupling means for transmitting a portion of said broadband signal to a subscriber, and a second coupling means for returning the broadband signal to the system;

a daughterboard having the electronic circuitry of a directional coupler thereon, said daughterboard having symmetrically arranged connection means constituting said directional coupler's input for receiving the broadband signal, subscriber output for providing a portion of the broadband signal to a subscriber, and return output for providing the remainder of the broadband signal to the system;

a unitary spring metal having a center portion;

first and second end portions on said unitary spring metal, wherein each respective end portion is biased to make contact with said first and second coupling means, respectively, when said housing is removed from said motherboard;

an electrically conductive continuity bridge connected to the motherboard;

wherein said continuity bridge maintains electrical continuity between said first and second coupling means on the motherboard when said daughterboard is not connected to said motherboard;

wherein said continuity bridge breaks electrical continuity between said first and second coupling means on the motherboard when said daughterboard is connected to said motherboard;

wherein said daughterboard is removably connected to said motherboard, and wherein said symmetrically arranged connection means on the daughterboard mate with the symmetrically arranged connection points on the motherboard in either a first position or a second position;

wherein in the first position the directional coupler's input, subscriber output, and return output are connected to the first coupling means, subscriber coupling means, and second coupling means, respectively; and wherein in the second position the directional coupler's input, subscriber output, and return output are connected to the second coupling means, subscriber coupling means, and first coupling means, respectively.

* * * * *